(12) United States Patent
Yeh et al.

(10) Patent No.: US 6,489,682 B1
(45) Date of Patent: Dec. 3, 2002

(54) BALL GRID ARRAY SEMICONDUCTOR PACKAGE AND SUBSTRATE THEREFOR

(75) Inventors: Yung I Yeh, Kaohsiung (TW); Shu Jung Ma, Kaohsiung (TW); Shiun Jaw Hsien, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 09/671,428

(22) Filed: Sep. 27, 2000

(51) Int. Cl.⁷ .......................... H01L 23/48; H01L 23/52; H01L 29/40
(52) U.S. Cl. .................. 257/738; 257/758; 257/774; 257/784
(58) Field of Search ................. 257/738, 700, 257/737, 758, 774, 777, 782, 784, 666, 668, 672, 674, 676; 361/737, 808, 809, 820

(56) References Cited

U.S. PATENT DOCUMENTS

| 5,168,368 A | 12/1992 | Gow, III et al. |
| 5,498,901 A | 3/1996 | Chillara et al. |
| 5,739,588 A | * 4/1998 | Ishida et al. ................ 257/782 |
| 5,767,575 A | 6/1998 | Lan et al. |

\* cited by examiner

*Primary Examiner*—Olik Chaudhuri
*Assistant Examiner*—Theresa T. Doan
(74) *Attorney, Agent, or Firm*—Stevens, Davis, Miller & Mosher, LLP

(57) ABSTRACT

A BGA semiconductor package comprises a chip mounted on the central region of the upper surface on the substrate. The substrate includes an upper surface, a lower surface, a ground plate disposed under the upper surface, and at least one power plate disposed between the ground plate and the lower surface. A ground ring surrounds the periphery of the chip and possesses a first set of serrated portions extending toward the outer edge of the substrate. A first power ring surrounds the ground ring and possesses a second set of serrated portions extending among the first set of serrated portions of the ground ring, such that the extending portions of the first and second sets of serrated rings interlace coincidentally with each other and the wire bonding distances from the bonding pads of chip surface to the extending portions of the first and the second serrated rings are comparable. According to another aspect of the present invention, a plurality of power vias are dispersedly distributed in the power ring to electrically connect the power ring to the power plate, wherein at least two power vias are coupled together. The coupled power vias can reduce the damage to the wholeness of ground plate thus enables the best electrical performance of the ground plate.

5 Claims, 4 Drawing Sheets

BALL GRID ARRAY SEMICONDUCTOR PACKAGE AND SUBSTRATE THEREFOR

BACKGROUND OF THE INVENTION

1. Field of the Invention

This invention relates to a ball grid array (BGA) semiconductor package, and more particularly to a BGA semiconductor package with enhanced electrical performance and package efficiency.

2. Description of the Related Art

As the demand for the lighter and more complicated semiconductor devices becomes increasing day by day, semiconductor chips become higher in speed and the complication of semiconductor devices thereby brings more electrical connections. The ball grid array (BGA) with high package efficiency has, therefore, been developed by the semiconductor chip packaging industry to meet these needs.

FIGS. 1 and 2 depicts a conventional BGA semiconductor chip package 100 with a chip 101 mounted on a substrate 102 which has a ground ring 103, two power rings 104 and a plurality of fingers 105. A number of bonding pads 106 are connected to the ground ring 103, two power rings 104 and a plurality of fingers 105 by bonding wires 107a–107d respectively. An area array of solder balls 108 are disposed at the lower surface of the substrate 102 for electrically connecting to the ground ring 103, the power ring 104, the fingers 105, the ground plate 103g and the power plate 104p through the vias 103v, 104v and 105v respectively. Each solder ball 108 is used for electrical connection to external circuit, such as a printed circuit board. Finally, a package body (not shown) encapsulates the chip 101, bonding wires 103 and the substrate 102 to form a BGA semiconductor package structure.

In the conventional BGA semiconductor chip package 100, all the ground ring 103, power rings 104 and the fingers 105 are arranged around the chip 101 with different distances and positions with respect to the chip 101, and thus different lengths of bonding wires are required for electrical connection. Accordingly, at least four different looping profiles 107a–107d of the bonding wires are necessary for connecting the bonding pads 106 to the ground ring 103, the power ring 104 and the fingers 105. So, it is necessary to set the operation parameters of wire bonding machine individually for bonding wire with each looping profile and then to operate the wire bonding. It takes four times of each operation to finish the wire bonding process for bonding wire with four looping profiles 107a–107d. More time is consumed for the bonding wire with more types of looping profiles. Furthermore, the more types of looping profiles of the bonding wires will result in the larger height and length of the outer bonding wire, thereby increasing the difficulties of wire bonding operation. For the package having the bonding wires with long and high looping profile, the bonding wire is easily broken especially for that with longer and higher looping profile, and the phenomenon of wire sweep also easily occurs during the encapsulation of package body. Furthermore, the packaging efficiency is reduced because package body with more volume is required to enclose all the bonding wires.

Besides the deficiency in package efficiency as described above, as long as the electrical performance is concerned, the impedance is significantly increased as the length of the bonding wire increases. This influences the electrical performance of BGA semiconductor package. As the bonding wire between the ground ring 103 and the power ring 104 becomes longer, the corresponding inductance and noise therebetween becomes larger. Larger inductance consumes more power in semiconductor package and induces power surges in bonding wire and the integrated circuit of chip 101 easily. In addition, the dispersed distribution of the power via 104v inside the power ring 104 destroys the wholeness of the ground plane 103g, and thus reduces electrical efficiency of ground plane 103g.

Accordingly, it becomes an important issue to reduce the length and the number of loop profiles of the bonding wire between the ground ring 103 and the power ring 104. Less looping profiles in bonding wire not only can improve electrical performance but also can enhance the package efficiency. Ideally, frequency response between the ground and power rings should be a low pass filter. It can obtain a better frequency response through reducing the inductance and increasing the capacitance of bonding wire. The improved frequency response leads to the operation of the semiconductor package in higher speed, with enhanced electrical performance and less power consumption.

SUMMARY OF THE INVENTION

The primary object of the present invention is to provide a novel structure of BGA semiconductor package with less looping profiles and shorter length of the bonding wire between the ground ring and the power ring such that the packaging efficiency can be enhanced.

The secondary object of the present invention is to provide a BGA semiconductor package with less looping profiles and shorter length in the bonding wire between the ground ring and the power ring such that the electrical performance of BGA semiconductor package can be improved.

Another object of the present invention is to provide a BGA semiconductor package with improved frequency response, wherein the semiconductor package can operate in higher speed and with enhanced electrical performance and less power consumption.

To achieve the above objects, according to the first preferred embodiment of the present invention, the chip is mounted on the central region of the upper surface on the substrate. The substrate includes an upper surface, a lower surface, a ground plate disposed under the upper surface, and at least one power plate disposed between the ground plate and the lower surface. A ground ring surrounds the periphery of the chip and possesses a first set of serrated portions extending toward the outer edge of the substrate. A first power ring surrounds the ground ring and possesses a second set of serrated portions extending among the first set of serrated portions of the ground ring, such that the extending portions of the first and second sets of serrated rings interlace coincidentally with each other and the wire bonding distances from the bonding pads of chip to the extending portions of the first and the second serrated rings are comparable. The first power ring also comprises another third set of serrated portions extending toward the outer edge of the substrate. The second power ring surrounds the first power ring and possesses a fourth set of serrated portions extending toward the third serrated ring, such that both the extending portions the third and fourth serrated rings interlace coincidentally with each other and the wire bonding distances from the bonding pads of chip to the extending portions of the third and the fourth serrated rings are comparable. According to the first embodiment of the present invention, only three looping profiles are employed for the bonding wires connecting the bonding pads to the ground ring, the two power rings and the fingers.

According to the second preferred embodiment of the present invention, the chip is mounted on the central region of the substrate, and the first ground ring possesses the first set of serrated portions extending toward the outer edge of the substrate. A second ground ring surrounds the first ground ring and possesses a second set of serrated portions extending toward the first serrated extending portions of the first ground ring, such that both the extending portions of the first and second serrated ground rings interlace coincidentally with each other and the wire bonding distances from the bonding pads of chip to the extending portions of the first and second serrated rings are comparable. A first power ring surrounds the second ground ring and possesses a third set of serrated portions extending toward the outer edge of the substrate. A second power ring surrounds the outer region of first power ring and possesses a fourth set of serrated portions extending toward the third serrated ring, such that both the extending portions of the third and fourth serrated rings interlace coincidentally with each other and the wire bonding distances from the bonding pads of chip to the extending portions of the third and fourth serrated rings are comparable. According to the second embodiment of the present invention, only three looping profiles are employed for the bonding wires connecting the bonding pads to the two ground rings, the two power rings and the fingers.

According to another aspect of the present invention, a plurality of power vias are dispersedly distributed in the power ring to electrically connect the power ring to the power plate, wherein at least two power vias are coupled together. The coupled power vias can reduce the damage to the wholeness of ground plate thus enables the best electrical performance of the ground plate. Moreover, the power vias are distributed radially with respect to the chip on the central of substrate so that the current can flow smoothly in the ground plate and the best electrical performance can thereby be achieved.

The present invention can significantly shorten the operation time for wire bonding, and reduce the height and the length of the bonding wire, thus the difficulty in wire bonding operation can be greatly decreased. This invention can also reduce the thickness of package body and thereby enhancing the packaging efficiency. Besides increasing the packaging efficiency, the present invention can prominently shorten the length of the bonding wire from bonding pads to the ground ring and the power ring, and thus decreases the corresponding inductance and noise to greatly enhance the electrical performance of semiconductor package. Since it can shorten the distance between the ground ring and the power ring, the corresponding inductance and capacitance therebetween can be respectively decreased and increased and a better frequency response can be achieved. The enhanced frequency response enables the semiconductor package to operate at a higher speed, with less power consumption and higher electrical performance.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 5:
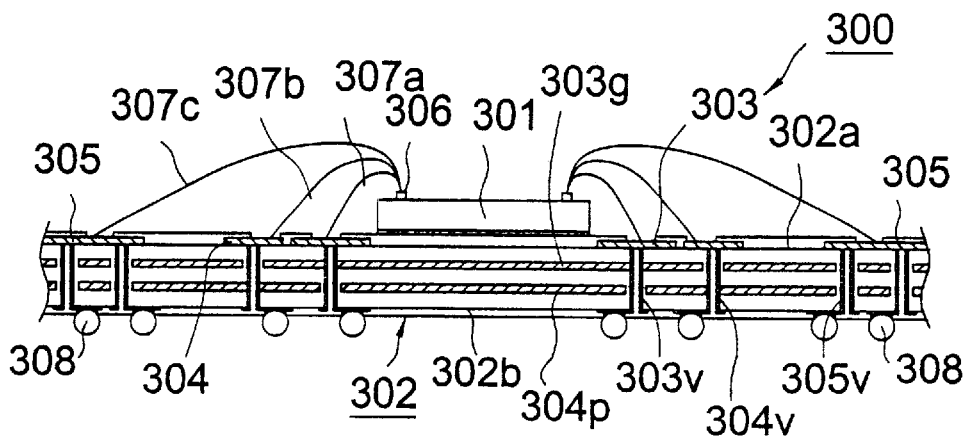
FIG. 5 is a cross-sectional view of the BGA semiconductor package in accordance with the first embodiment of the present invention.
Figure 6:
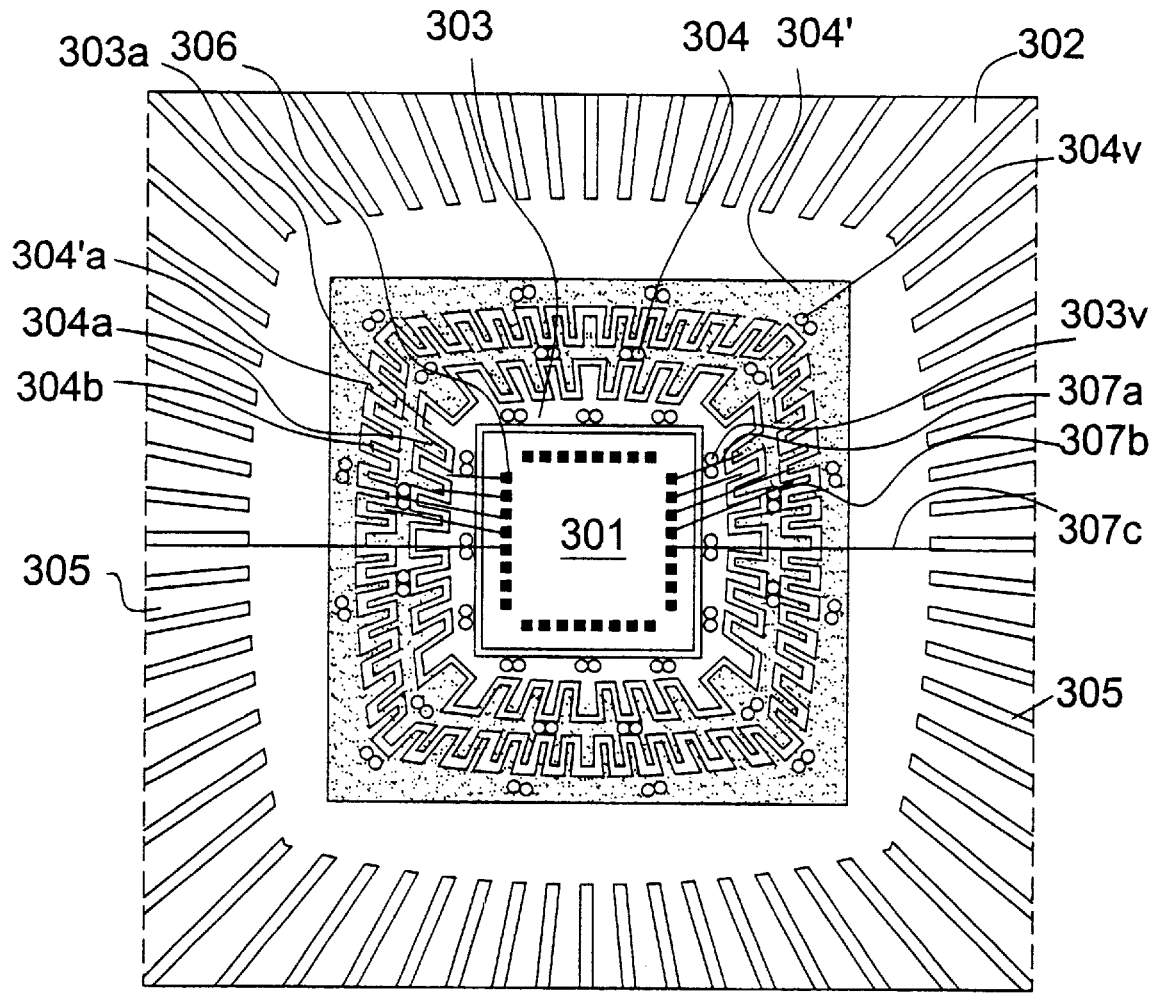
FIG. 6 is a top view of the BGA semiconductor package in accordance with the first embodiment of the present invention.

Referring to FIGS. 5 and 6 first, they illustrate the ball grid array (BGA) semiconductor package 300 in accordance with the first embodiment of the present invention. The semiconductor package 300 comprises a chip 301 attached on a substrate 302 having an upper surface 302a and a lower surface 302b, a ground plate 303g positioned under the upper surface 302a, and at least one power plate 304p positioned between the ground plate 303g and the lower surface 302b. The upper surface 302a of the substrate 302 has a ground ring 303, two power rings 304, 304' and a plurality of fingers 305. The bonding pads 306 on chip 301 are connected respectively to the ground ring 303, the two power rings 304 and 304', and the fingers 305 by bonding wires 307a, 307b and 307c. An area array of solder balls 308 are attached to the lower surface 302b and electrically connected through the vias 303v, 304v and 305v to the ground ring 303, the two power rings 304 and 304', the fingers 305 on the upper surface 302a, the ground plate 303g, and the power plate 304p. Each solder ball 308 is used for the electrical connection to the external circuitry. A package body encapsulates the chip 301, bonding wires 307 and the upper surface 302a of the substrate 302 to form a BGA semiconductor package.

According to the first embodiment of the present invention, the chip 301 is mounted on the central region of the upper surface 302a of the substrate 302. The ground ring 303 possesses a first set of serrated portions 303a extending toward the outer edge of the substrate. A first power ring 304 surrounds the ground ring 303 and possesses a second set of serrated portions 304a extending among the first set of serrated portions 303a of the ground ring 303, such that the first extending portions of the serrated ground ring and the second extending portions of the serrated power ring interlace coincidentally with each other and the wire bonding distances from the bonding pads of chip to the extending portions of the ground ring and the power ring are comparable. The first power ring 304 also comprises another third set of serrated portions 304b extending toward the outer edge of the substrate. The second power ring 304' surrounds the first power ring 304 and possesses the fourth set of serrated portions 304'a extending toward the third serrated ring 304b, such that both the extending portions the third and fourth serrated rings interlace coincidentally with each other and the wire bonding distances from the bonding pads of chip 301 to the extending portions of the third and the fourth serrated rings are comparable. According to the first embodiment of the present invention, only three looping profiles are employed for the bonding wires connecting the bonding pad to the ground ring, the two power rings and the fingers.

Figure 1:
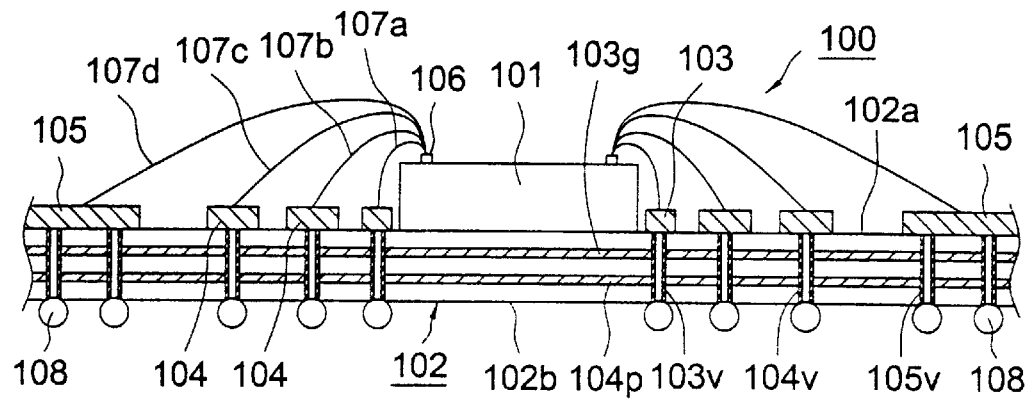
FIG. 1 is a cross-sectional view of a conventional BGA semiconductor package.
Figure 2:
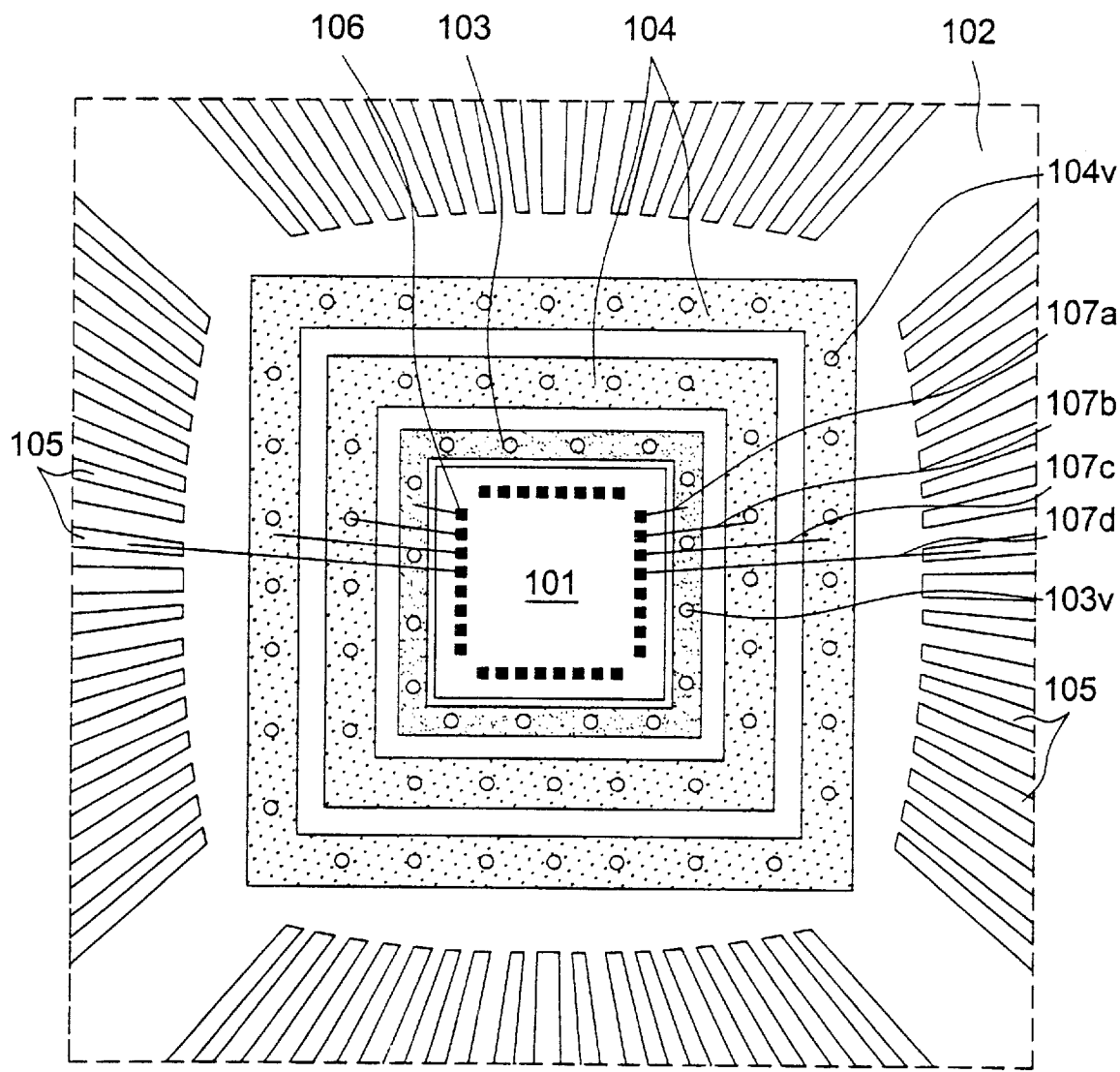
FIG. 2 is a top view of a conventional BGA semiconductor chip package.

According to FIGS. 5 and 6 again, the first embodiment of BGA semiconductor package in accordance with the present invention shows that the extending portions 303a of the serrated ground ring 303 interlace coincidentally with the extending portions 304a of the first serrated power ring 304 and the distances from the bonding pads 306 on the chip 301 to both extending portions 303a and 304b of the serrated ground and power rings 303 and 304 are comparable. Thus a first set of bonding wires 307a can electrically connect the bonding pads 306 to the extending portions 303a of the serrated ground ring 303 and the extending portions 304a of the serrated power ring 304 in the same looping profile. In the same way, the extending portions 304b of the first serrated power ring 304 interlace with the extending portions 304'a of the second serrated power ring 304' and the distances from the bonding pads 306 on the chip 301 to extending portions 304b and 304'a of both first and second serrated and power rings 304 and 304' are comparable. Thus a second set of bonding wires 307b can electrically connect the bonding pads 306 to the extending portions 304b of the serrated ground ring 304 and the extending portions 304'a of the serrated power ring 304' in the same looping profile. Furthermore, a third set of bonding wires 307c electrically connect the bonding pads 306 to the fingers. As compared to the conventional BGA semiconductor package structure as shown in FIGS. 1 and 2, the conventional BGA semiconductor package needs bonding wires of four different looping profiles 107a, 107b, 107c and 107d for electrically connecting the bonding pads 106 to the ground ring 103, the two power rings 104, and the fingers 105, while the present invention only needs bonding wires of three different looping profiles 307a, 307b and 307c for electrically connecting the bonding pads 306 to the ground ring 303, the two power rings 304, and the fingers 305. Accordingly, the present invention can reduce the operation time of wire bonding and the height and length of bonding wires, thereby significantly reducing difficulty and complexity for wire bonding operation. Furthermore, the present invention also reduces the thickness of package body and thus improves packaging efficiency.

According to another aspect of the present invention, a plurality of power vias 304v are dispersedly distributed in the power ring 304 to electrically connect the power ring 304 to the power plate 304p, wherein at least two power vias 304v are coupled together. It should be understood that the coupled power vias 304v can reduce the damage to the wholeness of ground plate 304g thus enables the best electrical performance of the ground plate 304g. Moreover, the power vias 304v are distributed radially with respect to the chip 301 on the central of substrate so that the current can flow smoothly in the ground plate 304g and the best electrical performance can thereby be achieved.

Figure 3:
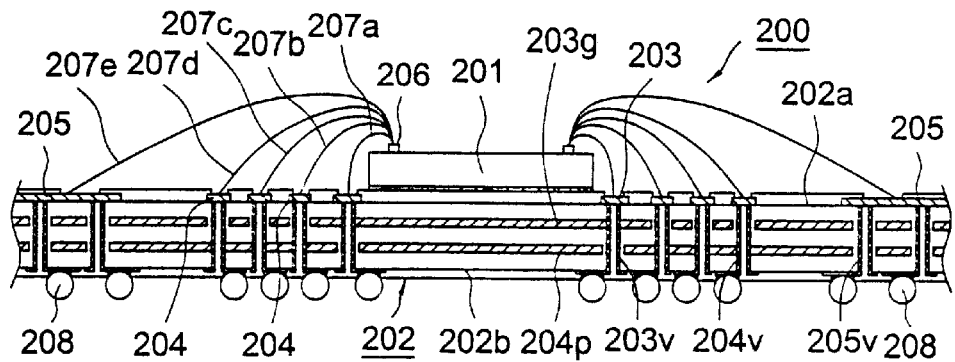
FIG. 3 is a cross-sectional view of another type of a conventional BGA semiconductor package.
Figure 4:
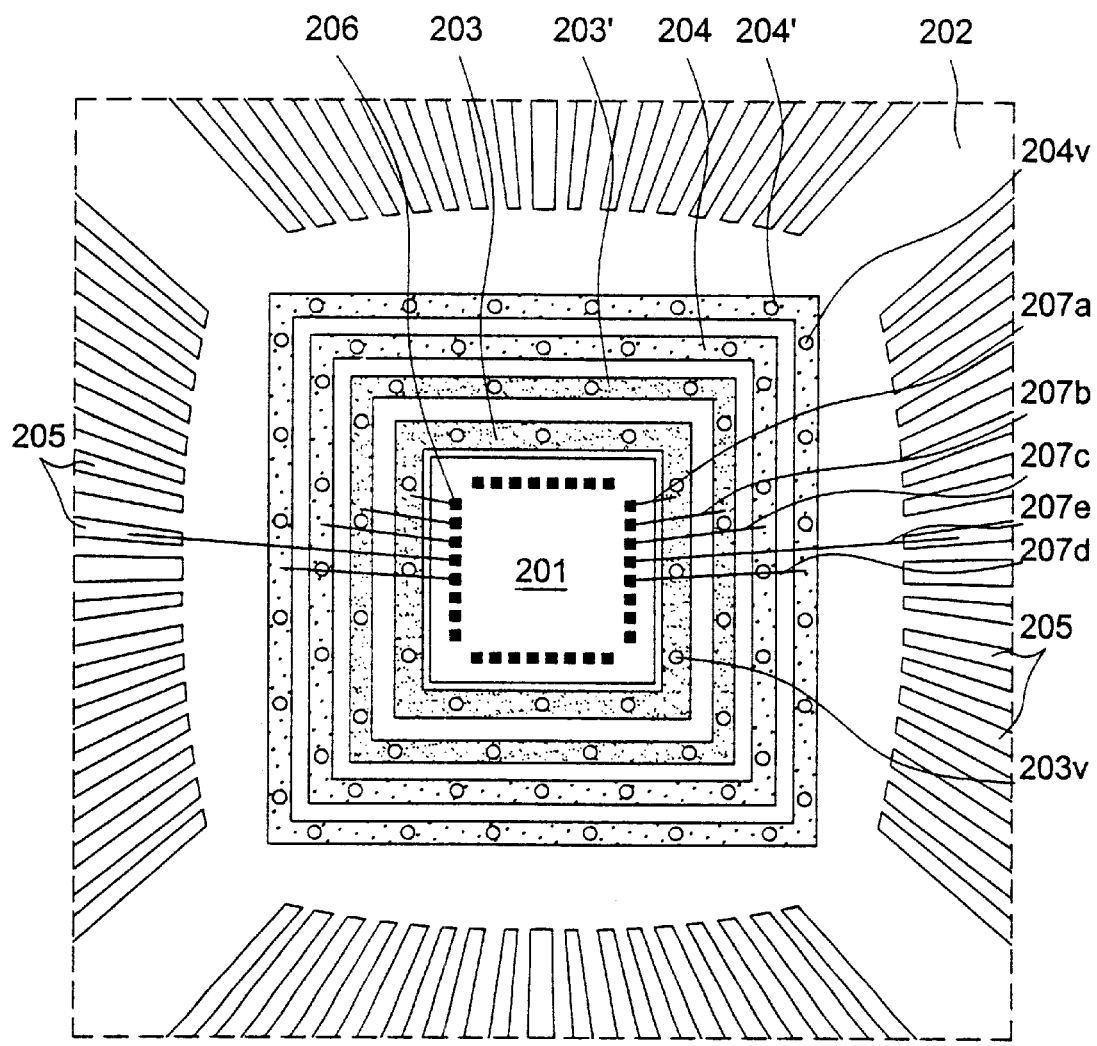
FIG. 4 is a top view of a conventional BGA semiconductor package as shown in FIG. 3.

Referring to the FIGS. 3 and 4, they illustrate another conventional BGA semiconductor package structure 200 which includes a chip 201 mounted on a substrate 202 on which there are two ground rings 203 and 203', two power rings 204 and 204' and a plurality of fingers 205. The bonding pads 206 on the chip 201 surface are connected to the two ground rings 203 and 203', the two power rings 204 and 204' and the fingers 205 through bonding wires 207a–e. An area array of solder balls 208, attached to the lower surface of the substrate 202, are electrically connected to the ground rings 203 and 203', the power rings 204 and 204' and the fingers 205 on the upper surface of the substrate through the vias. Last, a package body (not shown) encapsulates the chip 201, bonding wires 207 and the upper surface of the substrate to form a BGA semiconductor package structure 200. In this BGA semiconductor package structure, the bonding wire with five different looping profiles 207a–e are required for electrically connecting the bonding pads 206 to the ground rings 203 and 203', the power rings 204 and 204' and the fingers 205.

Figure 7:
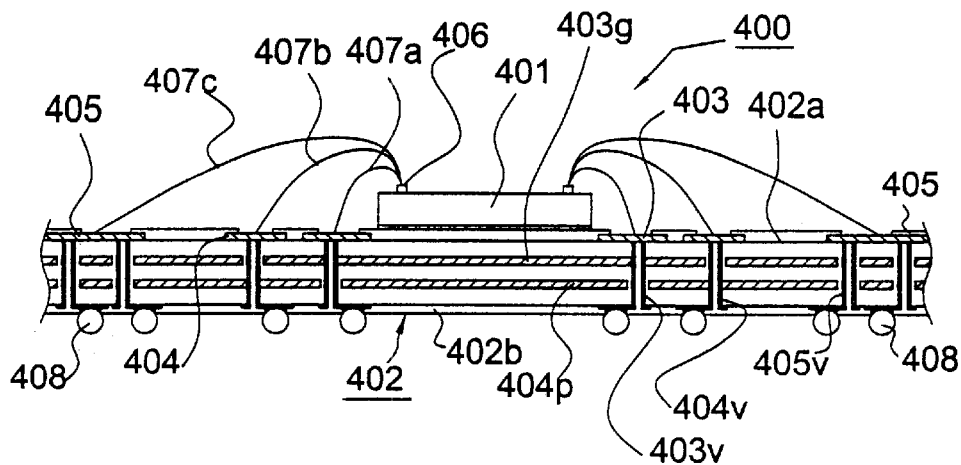
FIG. 7 is a cross-sectional view of the BGA semiconductor package in accordance with the second embodiment of the present invention.
Figure 8:
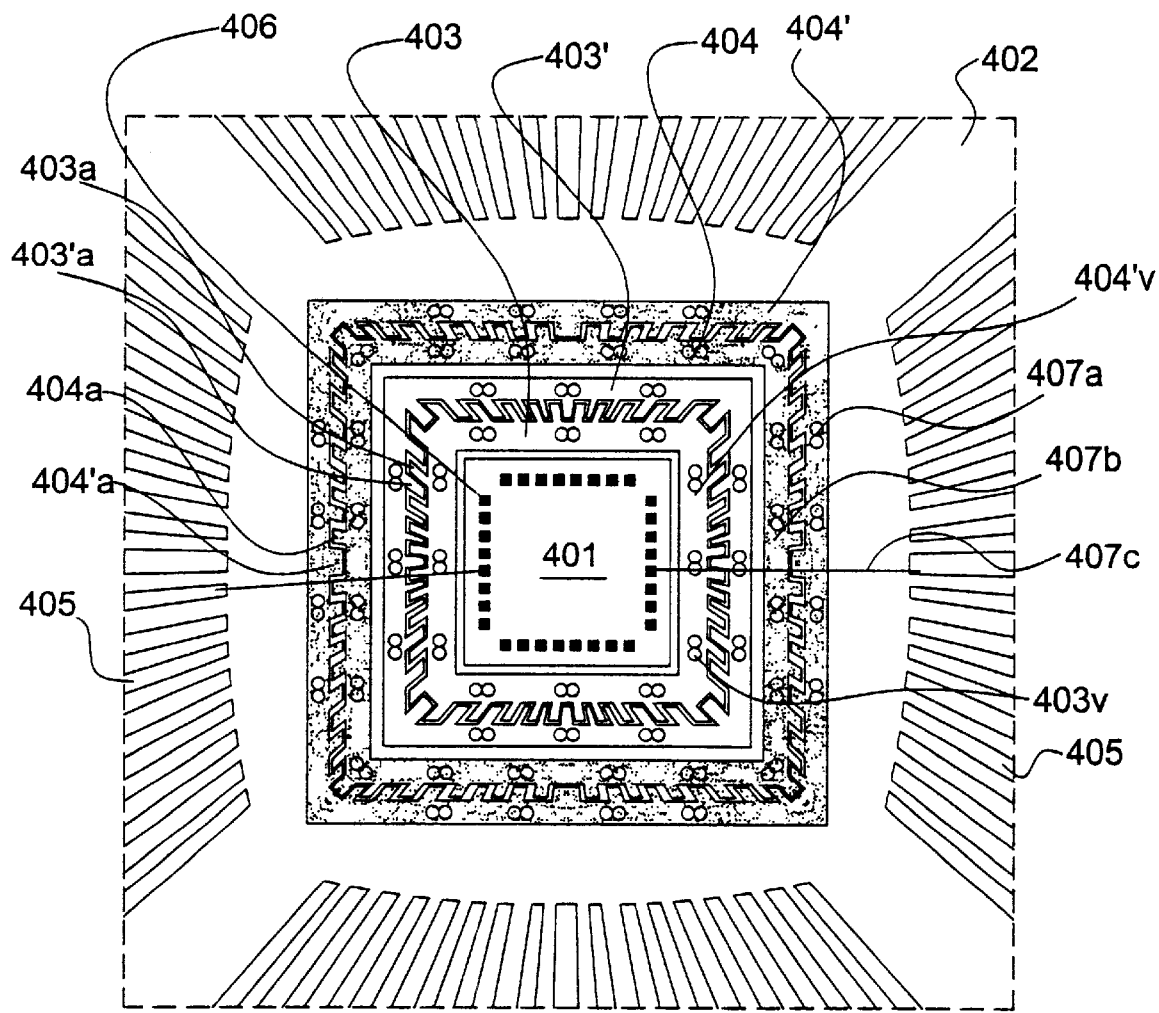
FIG. 8 is a top view of the BGA semiconductor package in accordance with the second embodiment of the present invention.

FIGS. 7 and 8 show the second preferred embodiment of the BGA semiconductor package 400. The BGA semiconductor package 400 includes a chip 401 mounted on a substrate 402 which compromises an upper surface 402a, a lower surface 402b, a ground plate 403g positioned under the upper surface 402, at least one power plate 404p between the ground plate 403g and the lower surface 402b. The upper surface 402a possesses two ground rings 403 and 403', two power rings 404 and 404', and a plurality of fingers 405. The bonding pads 406 on the chip 401 surface are connected to the two ground rings 403 and 403', the two power rings 404 and 404' and the fingers 405 through bonding wires 407a, 407b and 407c, respectively. An area array of solder balls 408, attached to the lower surface of the substrate 402, are electrically connected to the two ground rings 403 and 403', the two power rings 404 and 404' and the fingers 405 on the upper surface of the substrate 402, and to the ground plate 403g and power plate 404g through the vias 403v, 404v, 405v. Last, a package body (not shown) encapsulates the chip 401, bonding wires 407a, 407b, 407c, and the upper surface 402a of the substrate 402 to form a BGA semiconductor package structure 400.

According to the second embodiment of the BGA semiconductor package of the present invention, the chip 401 is mounted on the central region of the upper surface in the substrate 402, the first ground ring 403 possesses a first set of serrated portions 403a extending toward the outer edge of the substrate 401. The second ground ring 403', having a second set of serrated extending portions 403'a, surrounds the first ground ring 403 with its extending portions 403'a interlacing coincidentally with the extending portions 403a of the first ground ring 403, so that the distances from the bonding pads 406 on the chip 401 to the extending portions 403a and 403'a of both serrated ground rings 403 and 403' are comparable. The first power ring 404 surrounds the second ground ring 404' and possesses a serrated ring with a third set of extending portions 404a toward the outer edge of the substrate 401. The second power ring 404', having a fourth set of serrated extending portions 404'a, surrounds the first power ring 404 with its extending portions 404'a interlacing coincidentally with the extending portions 404a of the first power ring 404, so that the distances from the bonding pads 406 on the chip 401 to the extending portions 404a and 404'a of both serrated power rings 404 and 404' are comparable.

Referring to FIGS. 7 and 8 again, the second embodiment of BGA semiconductor package in accordance with the present invention shows that the extending portions 403a of the first serrated ground ring 403 interlace coincidentally with the extending portions 403'a of the second serrated power ring 403' and the distances from the bonding pads 406 on the chip 401 to both extending portions 403a and 403'a of the first and second ground rings 403 and 403' are comparable. Thus a first set of bonding wires 407a can electrically connect the bonding pads 406 to both the extending portions 403a of the first serrated ground rings 403 and the extending portions 403'a of the second ground rings 403' in the same looping profile. Similarly, the second set of bonding wires 407b can electrically connect the bonding pads 406 to the extending portions 404a and 404'a of the first and second serrated power rings 404 and 404' in the same looping profile. And the third set of bonding wire 407c is used for electrically connecting the bonding pads 406 to the fingers 405. As compared with the conventional BGA semiconductor package structure shown in FIGS. 3 and 4, five different looping profiles 207a–e of bonding wires are required for the conventional BGA semiconductor package structure, while only three different looping profiles 407a–c are required to reach the same electrical connection from the bonding pads 406 to the two ground rings, the two power rings and the fingers in accordance with the second embodiment of the present invention. Accordingly, the present invention can reduce the operation time of wire bonding and the height and length of bonding wires, thereby significantly reducing difficulty and complexity for wire bonding operation. Furthermore, the present invention also reduces the thickness of package body and thus improves the packaging efficiency.

According to another aspect of the present invention, a plurality of power vias 404v are dispersedly distributed in the power ring 404 to electrically connect the power ring 404 to the power plate 404p, wherein at least two power vias 404v are coupled together. It should be understood that the coupled power vias 404v can reduce the damage to the wholeness of ground plate 404g thus enables the best electrical performance of the ground plate 404g. Moreover, the power vias 404v are distributed radially with respect to the chip 401 on the central of substrate so that the current can flow smoothly in the ground plate 404g and the best electrical performance can thereby be achieved.

Besides increasing the packaging efficiency, the present invention can prominently shorten the length of the bonding wire from bonding pad to the ground ring and the power ring, and thus decreases the corresponding inductance and noise to greatly enhance the electrical performance of semiconductor package. Since it can shorten the distance between the ground ring and the power ring, the corresponding inductance and capacitance therebetween can be respectively decreased and increased and a better frequency response can be achieved. The enhanced frequency response enables the semiconductor package to operate at a higher speed, with less power consumption and higher electrical performance.

Although the invention has been explained in relation to its preferred embodiments as described above, it is to be understood that many other possible modifications and variations can be made without departing from the spirit and scope of the invention as hereinafter claimed.

What is claimed is:

1. A BGA semiconductor package comprising:
 a substrate having an upper surface, a lower surface, a ground plate disposed under the upper surface and at least one power plate disposed between the ground plate and the lower surface;
 a chip mounted in the central region of the upper surface of the substrate, the chip having a plurality bonding pads thereon,
 a ground ring disposed on the upper surface of the substrate surrounding the chip and having a first set of serrated portions extending toward the outer edge of the substrate;
 a first power ring surrounding the ground ring and having a second set of serrated extending portions interlacing coincidentally with the extending portions of the first serrated ground ring in a manner that the distances from the bonding pads to the first extending portions of the ground ring and the second extending portions of the power ring are comparable;
 a plurality of power vias disposed in the first power ring for connecting the power ring to the power plate, at least two of the power vias being coupled together;
 a plurality of fingers surrounding the power ring,
 a first set of bonding wires with a first looping profile electrically connecting the bonding pads to the first serrated extending portions of the ground ring and to the second extending portions of the power ring;
 a second set of bonding wires with a second looping profile electrically connecting the bonding pads to the fingers;
 a plurality of solder balls in area array disposed under the lower surface of the substrate for electrically connecting to the ground ring, the power ring and the fingers through vias;
 a package body encapsulating the chip, bonding wires and the upper surface of the substrate; and
 a second power ring surrounding the first power ring, the first power ring having a third set of serrated extending portions extending toward the outer edge of the substrate, and the second power ring having a fourth set of serrated extending portions interlacing coincidentally with the extending portions of the third serrated extending portions of the first power ring in a manner that the distances from the bonding pads to the third extending portions of the first power ring and the fourth extending portions of the second power ring are comparable.

2. The BGA semiconductor package as claimed in claim 1, further comprising a third set of bonding wires with a third looping profile electrically connecting the bonding pads to the third serrated extending portions of the first power ring and to the fourth serrated extending portions of the second power ring.

3. A BGA semiconductor package comprising:
 a substrate having an upper surface, a lower surface, a ground plate disposed under the upper surface and at least one power plate disposed between the ground plate and the lower surface;
 a chip mounted in the central region of the upper surface of the substrate, the chip having a plurality of bonding pads thereon;
 a first ground ring on the upper surface of the substrate surrounding the chip and electrically connecting to the ground plate, and having a first set of serrated portions extending toward the outer edge of the substrate;
 a second ground ring surrounding the first ground ring, electrically connecting to the ground plate, and having a second set of serrated extending portions which interlace coincidentally with the first set of serrated extending portions of the first ground ring in a manner that the distances from the bonding pads to the first extending portions of the first ground ring and the second extending portions of the second ground ring are comparable;
 a first power ring surrounding the second ground ring and having a third set of serrated portions extending toward the outer edge of the substrate;
 a second power ring surrounding the first power ring and having a fourth set of serrated extending portions which interlace coincidentally with the third extending portions of the first power ring in a manner that the distances from the bonding pads to the third extending portions of the first power ring and the fourth extending portions of the second power ring are comparable;

a plurality of power vias disposed in the first and second power rings for connecting the first and second power rings to the power plate, at least two of the power vias being coupled together;

a plurality of fingers surrounding the second power ring;

a first set of bonding wires with a first looping profile electrically connecting the bonding pads to the first serrated extending portions of the first ground ring and to the second extending portions of the second ground power ring;

a second set of bonding wires with a second looping profile electrically connecting the bonding pads to the third serrated extending portions of the first power ring and to the fourth extending portions of the second power ring;

a third set of bonding wires with a third looping profile electrically connecting the bonding pads to the fingers;

a plurality of solder balls in area array disposed under the lower surface of the substrate for electrically connecting to the ground rings, the power rings and the fingers through vias; and a package body encapsulating the chip, bonding wires and the upper surface of the substrate.

4. A substrate for a BGA semiconductor package comprising:

an upper surface, a lower surface, a ground plate disposed under the upper surface and at least one power plate disposed between the ground plate and the lower surface;

a predetermined region on the upper surface for supporting a chip with a plurality of bonding pads thereon;

a ground ring disposed on the upper surface of the substrate surrounding the chip supporting region and electrically connecting to the ground plate, the ground ring having a first set of serrated portions extending toward the outer edge of the substrate;

a first power ring surrounding the ground ring and having a second set of serrated extending portions interlacing coincidentally with the extending portions of the first serrated ground ring in a manner that the distances from the bonding pads to the first extending portions of the ground ring and the second extending portions of the power ring are comparable;

a plurality of power vias disposed in the first power ring, for connecting the power ring to the power plate, at least two of the power vias being coupled together;

a plurality of fingers surrounding the second power ring; and a second power ring surrounding the first power ring, the first power ring having a third set of serrated extending portions extending toward the outer edge of the substrate, and the second power ring having a fourth set of serrated extending portions interlacing coincidentally with the extending portions of the third serrated extending portions of the first power ring in a manner that the distances from the bonding pads to the third extending portions of the first power ring and the fourth extending portions of the second power ring are comparable.

5. A substrate for a BGA semiconductor package comprising:

an upper surface, a lower surface, a ground plate disposed under the upper surface and at least one power plate disposed the ground plate and the lower surface;

a predetermined region on the upper surface for supporting a chip with a plurality of bonding pads thereon;

a first ground ring on the upper surface of the substrate, surrounding the chip, electrically connecting to the ground plate, and having a first set of serrated portions extending toward the outer edge of the substrate;

a second ground ring surrounding the first ground ring, electrically connecting to the ground plate, and having a second set of serrated extending portions which interlace coincidentally with the first set of serrated extending portions of the first ground ring in a manner that the distances from the bonding pads to the first extending portions of the first ground ring and the second extending portions of the second ground ring are comparable;

a first power ring surrounding the second ground ring and having a third set of serrated portions extending toward the outer edge of the substrate;

a second power ring surrounding the first power ring and having a fourth set of serrated extending portions which interlace coincidentally with the third extending portions of the first power ring in a manner that the distances from the bonding pads to the third extending portions of the first power ring and the fourth extending portions of the second power ring are comparable;

a plurality of power vias disposed in the first and second power rings for connecting the first and second power rings to the power plate, at least two of the power vias being coupled together; and a plurality of fingers surrounding the second power ring.

* * * * *